(12) United States Patent
Wang

(10) Patent No.: US 12,417,984 B2
(45) Date of Patent: Sep. 16, 2025

(54) SEMICONDUCTOR STRUCTURE WITH AN AIR GAP, METHOD FOR FORMING SAME, AND STACKED STRUCTURE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 617 days.

(21) Appl. No.: 17/650,381

(22) Filed: Feb. 8, 2022

(65) Prior Publication Data

US 2022/0320005 A1 Oct. 6, 2022

Related U.S. Application Data

(63) Continuation of application No. PCT/CN2021/109103, filed on Jul. 29, 2021.

(30) Foreign Application Priority Data

Apr. 1, 2021 (CN) .......................... 202110356149.3

(51) Int. Cl.
*H01L 23/552* (2006.01)
*H01L 21/768* (2006.01)
*H01L 23/48* (2006.01)

(52) U.S. Cl.
CPC ...... *H01L 23/552* (2013.01); *H01L 21/76831* (2013.01); *H01L 21/76898* (2013.01); *H01L 23/481* (2013.01)

(58) Field of Classification Search
CPC ......... H01L 21/76898; H01L 23/49827; H01L 23/5384; H01L 23/481; H01L 2225/06541
See application file for complete search history.

(56) References Cited

U.S. PATENT DOCUMENTS

| | | | |
|---|---|---|---|
| 7,964,972 B2 | 6/2011 | Matsui | |
| 9,024,390 B2 | 5/2015 | Miyajima | |
| 9,275,933 B2 | 3/2016 | Kuo | |
| 9,842,774 B1 | 12/2017 | Fang et al. | |
| 11,031,348 B2 | 6/2021 | Shih et al. | |
| 2006/0001174 A1 | 1/2006 | Matsui | |
| 2013/0334669 A1 | 12/2013 | Kuo | |
| 2014/0070426 A1* | 3/2014 | Park | H01L 23/53238 257/774 |
| 2017/0358493 A1* | 12/2017 | Fang | H01L 21/02164 |
| 2021/0028121 A1 | 1/2021 | Shih et al. | |

FOREIGN PATENT DOCUMENTS

CN 112310022 A 2/2021

* cited by examiner

*Primary Examiner* — Jesse Y Miyoshi
(74) *Attorney, Agent, or Firm* — Syncoda LLC; Feng Ma

(57) ABSTRACT

A semiconductor structure includes: a base, including a substrate and a dielectric layer, the substrate being provided with a first front surface and a first back surface which are opposite, and the dielectric layer being located at the first front surface; a connecting hole, penetrating through the substrate and extending into the dielectric layer; a first insulating layer, located at the surface of an inner wall of the connecting hole; a protective barrier layer, located at the surface of the first insulating layer and grounded; a second insulating layer, located at the surface of the protective barrier layer; and a connecting structure, located at the surface of the second insulating layer and filling up the connecting hole.

18 Claims, 29 Drawing Sheets

SEMICONDUCTOR STRUCTURE WITH AN AIR GAP, METHOD FOR FORMING SAME, AND STACKED STRUCTURE

CROSS-REFERENCE TO RELATED APPLICATIONS

This is a continuation of International Application No. PCT/CN2021/109103 filed on Jul. 29, 2021, which claims priority to Chinese Patent Application No. 202110356149.3 filed on Apr. 1, 2021. The disclosures of these applications are hereby incorporated by reference in their entirety.

BACKGROUND

A through-silicon via (TSV) technology is a technical solution which realizes interconnection by stacking chips in a three-dimensional integrated circuit. The TSV technology becomes the most attractive technology in the current electronic packaging technologies as it can effectively stack chips in the three-dimensional direction, and therefore manufacture an electronic device with more complex structure, stronger performance and more cost-effective.

SUMMARY

The application relates to the technical field of integrated circuits, and in particular to a semiconductor structure, a method for forming the same, and a stacked structure.

According to some embodiments, a semiconductor structure, a method for forming the same, and a stacked structure are provided.

A semiconductor structure includes a base, a connecting hole, a first insulating layer, a protective barrier layer, a second insulating layer and a connecting structure.

The base includes a substrate and a dielectric layer. The substrate is provided with a first front surface and a first back surface which are opposite. The dielectric layer is located at the first front surface.

The connecting hole penetrates through the substrate and extends into the dielectric layer.

The first insulating layer is located at the surface of an inner wall of the connecting hole.

The protective barrier layer is located at the surface of the first insulating layer. The protective barrier layer is grounded.

The second insulating layer is located at the surface of the protective barrier layer.

The connecting structure is located at the surface of the second insulating layer and filled in the connecting hole.

A method for forming a semiconductor structure includes the following operations.

A base is provided. The base includes a substrate and a dielectric base layer. The substrate is provided with a first front surface and a first back surface which are opposite. The dielectric base layer is located at the first front surface. A connecting hole is formed in the base. The connecting hole penetrates through the substrate and extends into the dielectric base layer.

A first insulating layer, a protective barrier layer, a second insulating layer and a connecting structure are formed in the connecting hole.

The first insulating layer is located at the surface of an inner wall of the connecting hole.

The protective barrier layer is located at the surface of the first insulating layer.

The second insulating layer is located at the surface of the protective barrier layer.

The connecting structure is located at the surface of the second insulating layer and filled in the connecting hole.

Part of the dielectric base layer is removed, so that the protective barrier layer is grounded. The retained dielectric base layer constitutes a dielectric layer.

A stacked structure is formed by processing any one of the above described semiconductor structure described in any one of the above.

The above description is only an overview of the technical solution of the application. In order to better understand the technical means of the application and implement it in accordance with the contents of the description, description in detail is performed below through better embodiments of the application and in combination with the drawings.

BRIEF DESCRIPTION OF THE DRAWINGS

In order to describe the technical solutions in the embodiments of the application or a conventional art more clearly, the drawings required to be used in descriptions about the embodiments or the conventional art will be simply introduced below. It is apparent that the figures described below are only some embodiments of the application. Other figures may further be obtained by those of ordinary skilled in the art according to these drawings without creative work.

DETAILED DESCRIPTION

Figure 1:
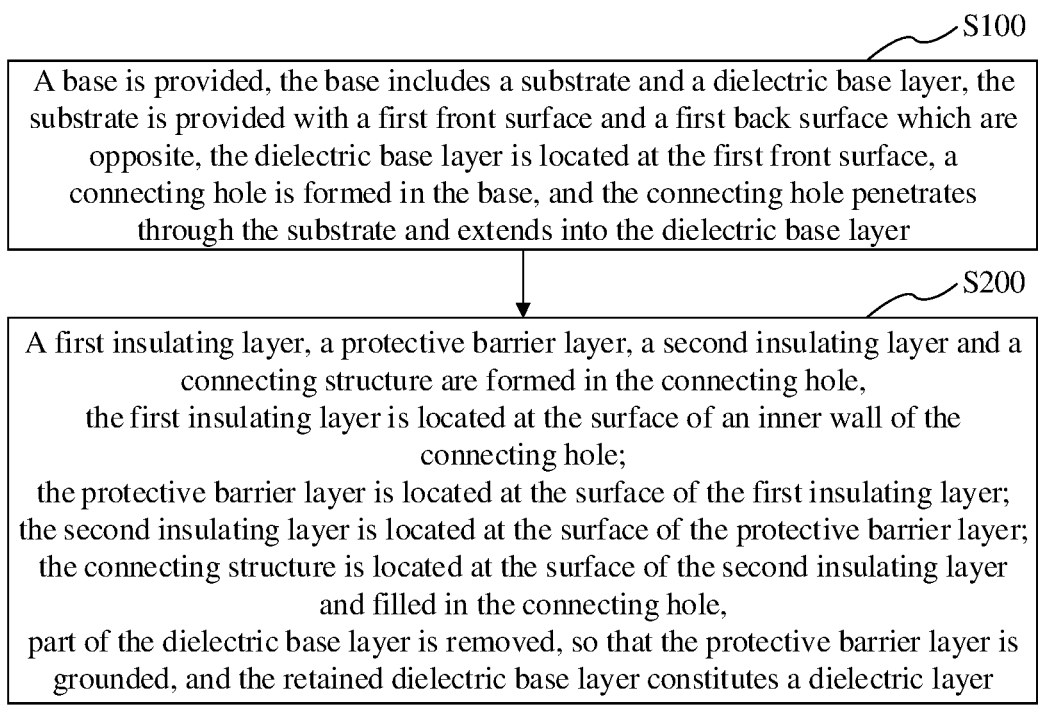
FIG. 1 is a flowchart of a method for forming a semiconductor structure according to an embodiment.

In order to make the application convenient to understand, the application will be described more comprehensively below with reference to the related drawings. The drawings show embodiments of the application. However, the application may be implemented in various forms and is not limited to the embodiments described herein. On the contrary, these embodiments are provided to make the contents disclosed in the application understood more thoroughly and comprehensively.

Unless otherwise defined, all technical and scientific terms used herein have the same meanings as commonly understood by a person skilled in the art that the application belongs to. Herein, terms used in the description of the application are only for the purpose of describing specific embodiments and not intended to limit the application.

It is to be understood that description that an element or layer is "on", "adjacent to", "connected to", or "coupled to" another element or layer may refer to that the element or layer is directly on, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood, although various elements, components, regions, layers, doping types and/or parts may be described with terms first, second, third, etc., these elements, components, regions, layers, doping types and/or parts should not be limited by these terms. These terms are used only to distinguish one element, component, area, layer, doping type or part from another element, component, area, layer, doping type or part. Therefore, a first element, component, region, layer, doping type or part discussed below may be represented as a second element, component, region, layer or part without departing from the teaching of the disclosure.

Spatially relational terms such as "below", "under", "lower", "beneath", "above", and "upper" may be used herein for describing a relationship between one element or feature and another element or feature illustrated in the figures. It is to be understood that, in addition to the orientation shown in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. Moreover, the device may include otherwise orientation (such as rotation by 90 degrees or in other orientations) and the spatial descriptors used herein may be interpreted accordingly.

As used herein, singular forms "a", "an", and "the/said" may also include plural forms, unless otherwise specified in the context. It is also to be understood that, terms such as "comprising/containing" or "having" represent the existence of declarative features, wholes, steps, operations, components, parts or combinations thereof, but not excluding the possibility of the existence or addition of one or more other features, wholes, steps, operations, components, parts or combinations of them. Meanwhile, in the specification, term "and/or" includes any and all combinations of the related listed items.

Referring to a cross section diagram of a schematic diagram of an ideal embodiment (and an intermediate structure) of the disclosure herein, applied embodiments are described, so that change of shown shapes due to a manufacturing technology and/or tolerance may be predicted. Therefore, the embodiments of the disclosure should not be limited to specific shapes of shown areas, but including shape deviation due to the manufacturing technology.

Due to an electromagnetic field of transmission signals of TSV structures, the noise coupling between the TSV structures is quite serious. Particularly, in a high-density array of TSV structures, the influence of coupling capacitance and coupling inductance has become a major factor affecting the electrical performance of the TSV structure.

In an embodiment, referring to FIG. 1, a method for forming a semiconductor structure includes the following operations.

Figure 5:
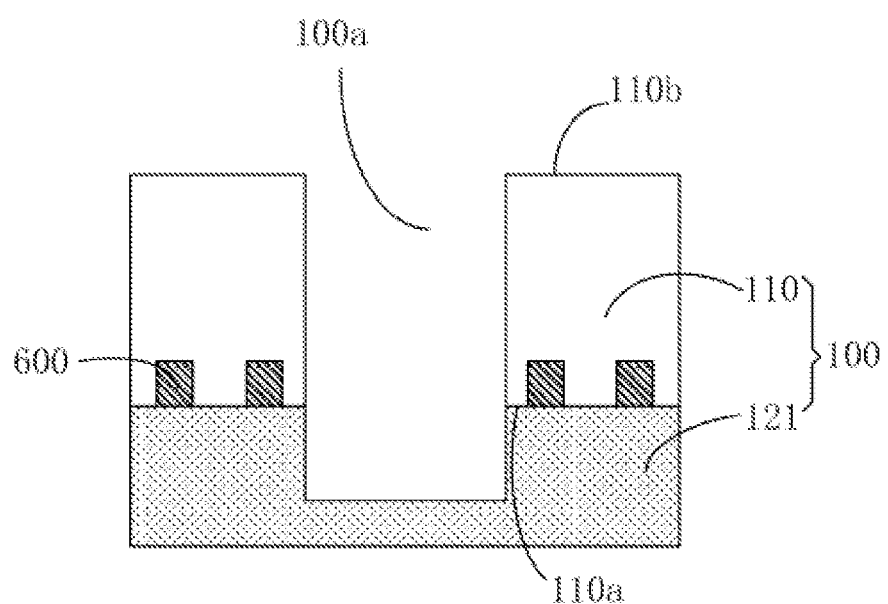
FIG. 5 is a first structural schematic structural diagram showing a semiconductor structure manufacturing process.

Referring to FIG. 5, at S100, a base 100 is provided. The base 100 includes a substrate 110 and a dielectric base layer 121. The substrate 110 is provided with a first front surface 110a and a first back surface 110b which are opposite. The dielectric base layer 121 is located at the first front surface 110a. A connecting hole 100a is formed in the base 100. The connecting hole 100a penetrates through the substrate 110 and extends into the dielectric base layer 121.

Figure 24:
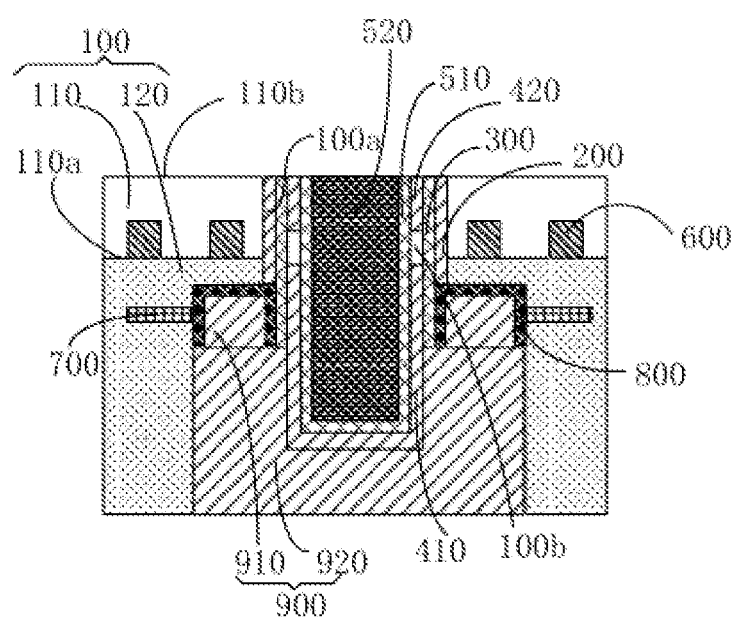
FIG. 24 is a first schematic diagram of semiconductor structures in different embodiments.

Referring to FIG. 24, at S200, a first insulating layer 200, a protective barrier layer 300, a second insulating layer 400 and a connecting structure 500 are formed at the surface of an inner wall of the connecting hole 100a. The protective barrier layer 300 is grounded. The first insulating layer 200 is located at the surface of the inner wall of the connecting hole 100a. The protective barrier layer 300 is located at the surface of the first insulating layer 200. The second insulating layer 400 is located at the surface of the protective barrier layer 300. The connecting structure 500 is located at the surface of the second insulating layer 400 and filled in the connecting hole 100a. Part of the dielectric base layer 121 is removed, so that the protective barrier layer 300 is grounded. The retained dielectric base layer 121 constitutes a dielectric layer 120.

In S100, the substrate 110 may include, but not limited to, a silicon substrate. A shallow trench isolation structure 600 may be formed at one side, close to the dielectric base layer 121, of the substrate 110. The shallow trench isolation structure 600 isolates the substrate 110 into multiple active areas. The active areas are configured to form various semiconductor devices.

The dielectric base layer 121 may include, but not limited to, an oxide layer such as a silicon dioxide layer. An interconnecting hole structure and a metal layer electrically connected with the active area may be formed in the dielectric base layer 121, so as to lead out a signal of a semiconductor device or provide an external signal to the semiconductor device.

The interior of the connecting hole 100a is configured to form a connecting structure 500. When chips formed by multiple semiconductor structures are stacked, the corresponding connecting holes 100a from various chips are aligned, so that the connecting structures 500 in the various corresponding connecting hole 100a are electrically connected, and thus interconnection among the various chips is realized.

In S200, the first insulating layer 200 is located between the protective barrier layer 300 and the inner wall of the connecting hole 100a, so as to realize electrical isolation between the protective barrier layer 300 and the substrate 110. The material of the first insulating layer 200 may be silicon dioxide, etc. The material of the first insulating layer and the material of the dielectric base layer 121 may be the same or not.

The material of the first insulating layer 200 may be silicon dioxide, etc.

The material of the protective barrier layer 300 may be tantalum (Ta) and/or tantalum nitride (TaN), etc. Moreover, the protective barrier layer 300 is connected to the ground.

The second insulating layer 400 is located between the connecting structure 500 and the protective barrier layer 300, so as to realize electrical isolation between the connecting structure 500 and the protective barrier layer 300. The material of the second insulating layer 400 may be silicon dioxide, etc. The material of the second insulating layer and the material of the first insulating layer 200 may be the same or not.

The connecting structure 500 is a structure capable of performing conductive connection, and may include multiple film layers. Certainly, the connecting structure 500 may also only include one film layer, and there is no limitation in the application.

After the connecting structure 500 is formed, annealing treatment is usually executed to make the size of particles such as metal in the connecting structure 500 more uniform, so as to reduce the resistivity and improve the electromigration resistance. However, after annealing, the grain size of the particles such as metal in the connecting structure 500 increases obviously, so that the structure surface formed by them will become rough, resulting in interface stress and increasing the possibility of current leakage.

The material of the protective barrier layer 300 may be Ta and/or TaN, which can effectively inhibit the enlargement of the particles such as metal in the connecting structure 500 during annealing, so as to effectively reduce the interface stress. Meanwhile, the protective barrier layer 300 can also prevent the particles such as metal in the connecting structure 500 from diffusing to the substrate 110 and the dielectric layer 120.

The semiconductor structure usually includes multiple connecting structures 500. Due to existence of an electromagnetic field of transmission signals of the connecting structures 500, the various connecting structures 500 are easily affected by noise coupling. Particularly, in a high-density array of the connecting structures 500, the connecting structures 500 are easily affected by coupling capacitance and coupling inductance, so as to affect the electrical performance of the connecting structures 500.

In the embodiment, on one hand, the protective barrier layer 300 located in the connecting hole 100a is used to prevent the particles such as metal in the connecting structure 500 from becoming larger during annealing, so as to inhibit thermal stress. On the other hand, the protective barrier layer 300 located in the connecting hole 100a is grounded, so that it also forms an electromagnetic shielding ring at the periphery of the connecting structure 500 while inhibiting stress, thereby effectively avoiding signal coupling among the various connecting structures 500 and among the connecting structures 500 and surrounding semiconductor devices.

In an embodiment, referring to FIG. 5, the connecting hole 100a is formed by etching from the first back surface 110b.

As an example, the base 100 as shown in FIG. 5 is etched from the first back surface 110b through a dry etching method to form the connecting hole 100a.

The depth of the connecting hole 100a may be 20-150 µm, and the depth of the connecting hole 100 extending into the dielectric base layer 121 may be 0.5-1 µm. The diameter of the connecting hole 100a may be 3-50 µm. The depth-to-width ratio (namely a ratio of the depth to the diameter) of the connecting hole 100a may be 0.4-50.

Since the first back surface 110b of the substrate 110 is farther from the semiconductor device formed in the active area and a line structure connecting the semiconductor device, the embodiment can effectively prevent damage to the semiconductor device formed in the active area and the related circuit structure when forming the connecting hole 100a.

Figure 18:
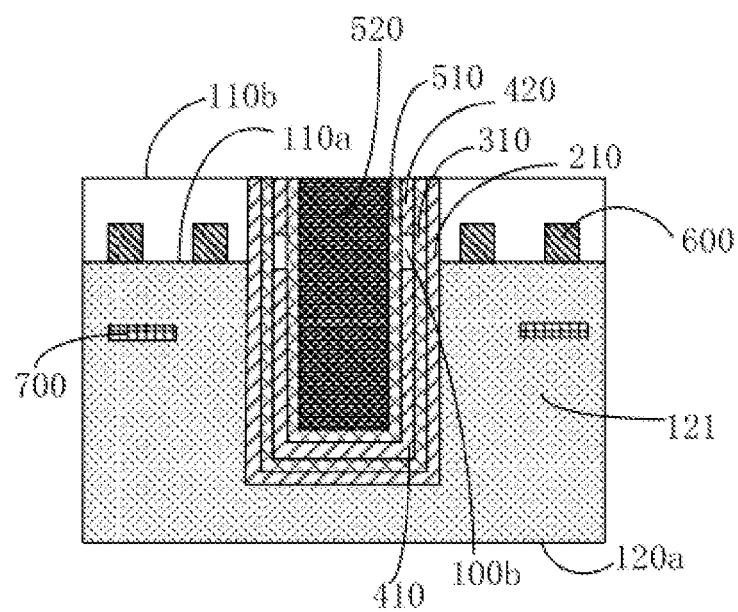
FIG. 18 is a fourteenth structural schematic structural diagram showing a semiconductor structure manufacturing process.
Figure 25:
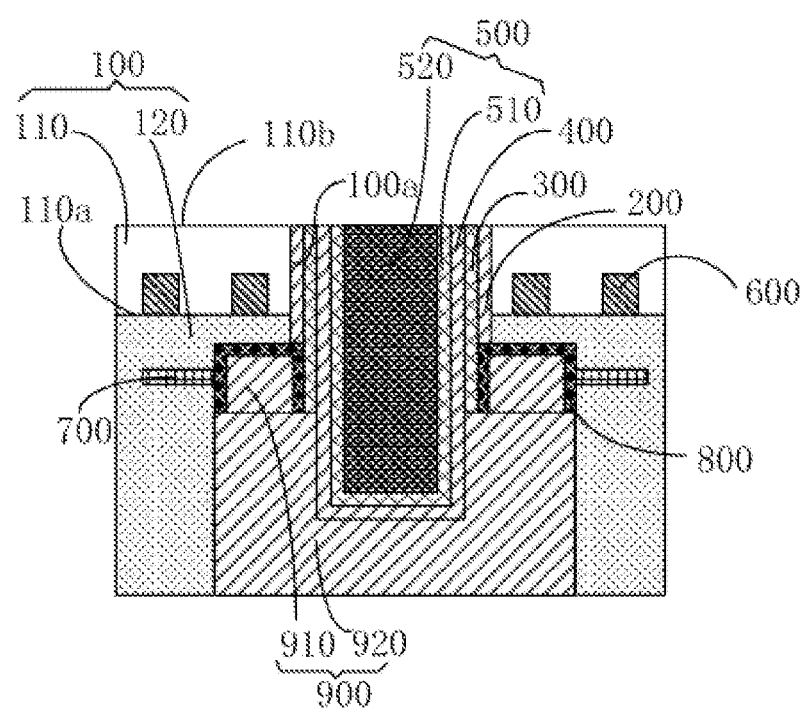
FIG. 25 is a second schematic diagram of semiconductor structures in different embodiments.

In an embodiment, referring to FIG. 18 and FIG. 25, a metal layer 700 is arranged in the dielectric base layer 121. The protective barrier layer 300 is grounded through the metal layer 700.

Specifically, the metal layer 700 is used to lead out a signal in the semiconductor device or introduce an external signal.

According to the application, the protective barrier layer 300 is grounded through the metal layer 700, so that an electromagnetic shielding ring can be formed conveniently and effectively.

Figure 19:
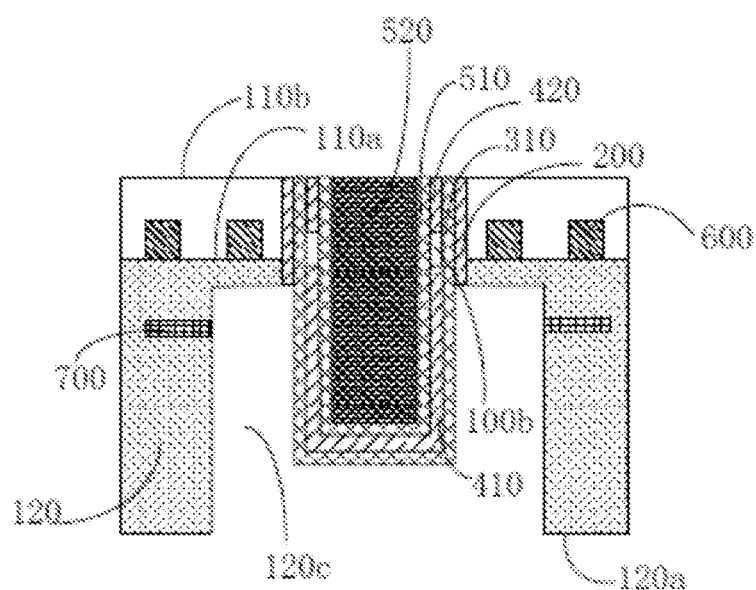
FIG. 19 is a fifteenth structural schematic structural diagram showing a semiconductor structure manufacturing process.

In an embodiment, referring to FIG. 19, the dielectric base layer 122 is provided with a second front surface 120a. The second front surface 120a is far away from the first front surface 110a of the substrate 110.

Figure 2:
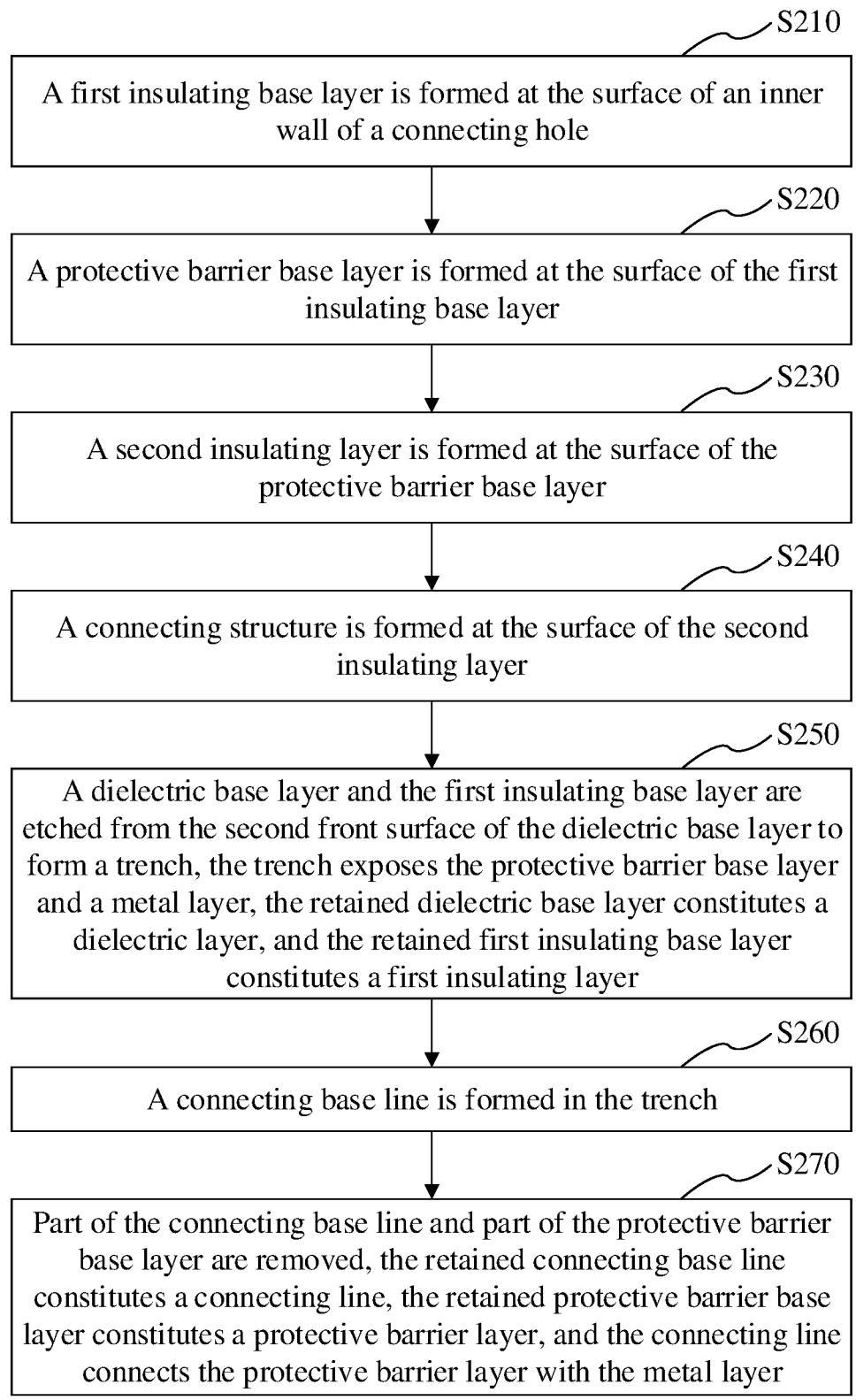
FIG. 2 is a flowchart of forming a first insulating layer, a protective barrier layer, a second insulating layer and a connecting structure in a connecting hole according to an embodiment.

Referring to FIG. 2, S200 includes the following operations.

Figure 6:
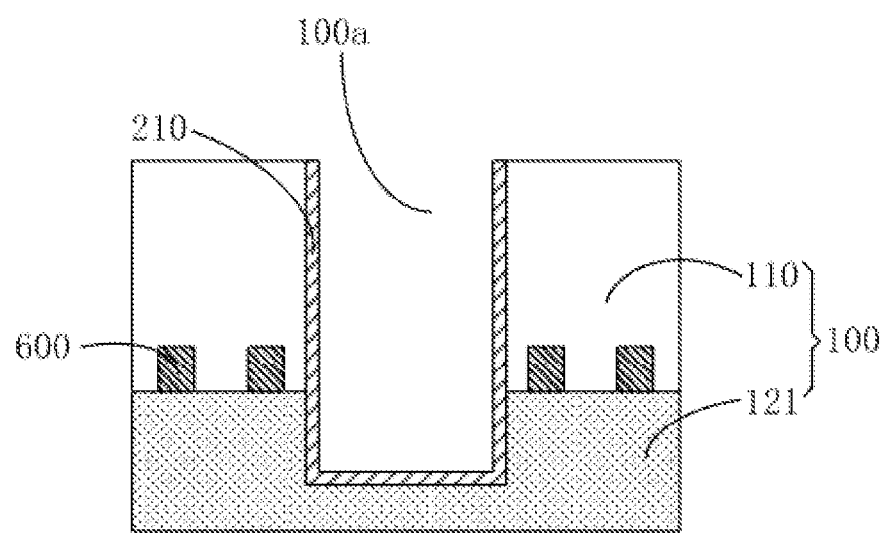
FIG. 6 is a second structural schematic structural diagram showing a semiconductor structure manufacturing process.

At S210, referring to FIG. 6, a first insulating base layer 210 is formed at the surface of an inner wall of the connecting hole 100a.

Figure 7:
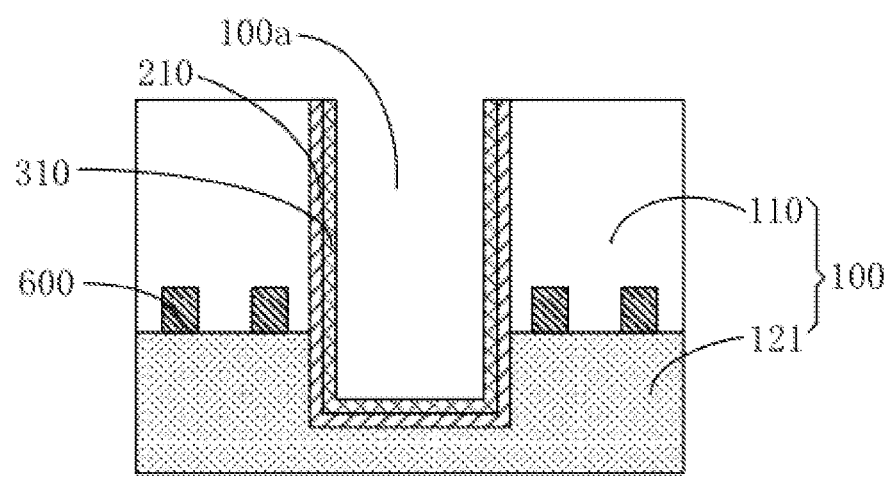
FIG. 7 is a third structural schematic structural diagram showing a semiconductor structure manufacturing process.

At S220, referring to FIG. 7, a protective barrier base layer 310 is formed at the surface of the first insulating base layer 210.

Figure 14:
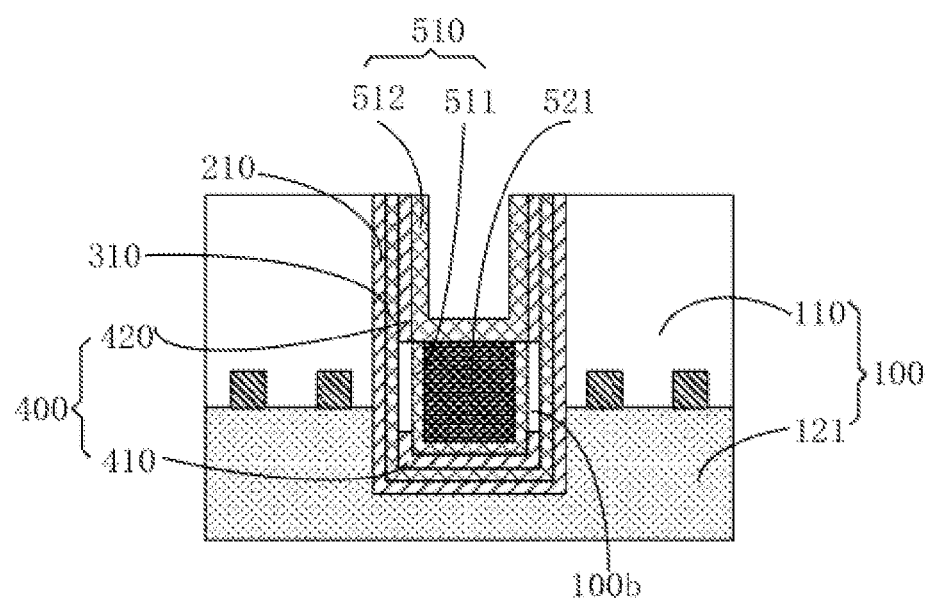
FIG. 14 is a tenth structural schematic structural diagram showing a semiconductor structure manufacturing process.

At S230, referring to FIG. 14, the second insulating layer 400 is formed at the surface of the protective barrier base layer 310.

At S240, referring to FIG. 15, FIG. 16, FIG. 17 or FIG. 18, the connecting structure 500 is formed at the surface of the second insulating layer 400.

At S250, referring to FIG. 19, the dielectric base layer 122 and the first insulating base layer 210 are etched from the second front surface 120a of the dielectric base layer 122 to form a trench 120c. The trench 120c exposes the protective barrier base layer 310 and the metal layer 700. The retained dielectric base layer 122 constitutes the dielectric layer 120, and the retained first insulating base layer 210 constitutes the first insulating layer 200.

Figure 20:
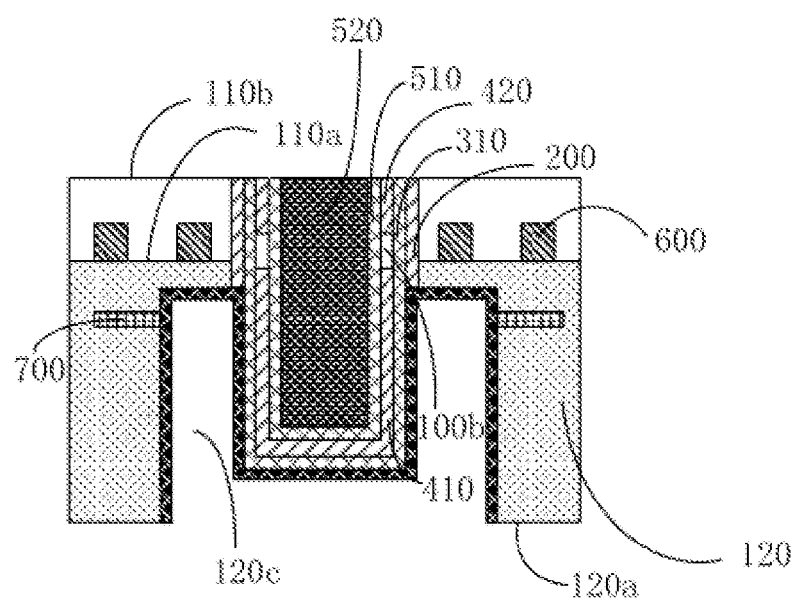
FIG. 20 is a sixteenth structural schematic structural diagram showing a semiconductor structure manufacturing process.

At S260, referring to FIG. 20, a connecting base line 810 is formed in the trench 120c.

Figure 23:
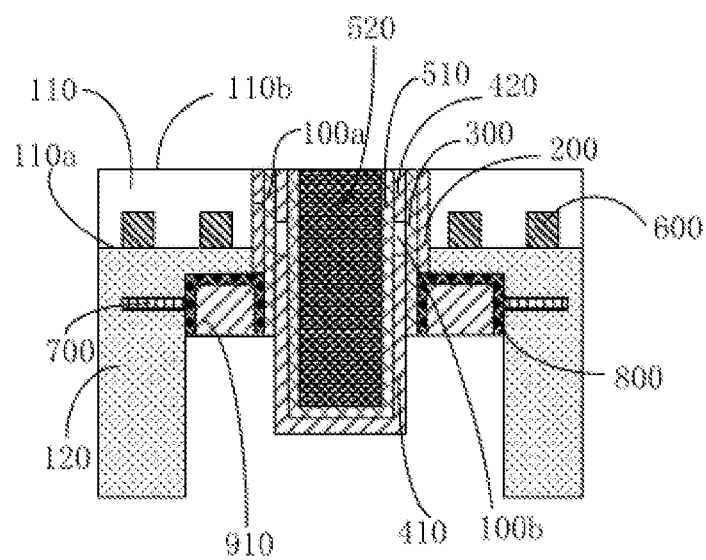
FIG. 23 is a nineteenth structural schematic structural diagram showing a semiconductor structure manufacturing process.

At S270, referring to FIG. 23, part of the connecting base line 810 and part of the protective barrier base layer 310 are removed. The retained connecting base line 810 constitutes a connecting line 800, the retained protective barrier base layer 310 constitutes the protective barrier layer 300. The connecting line 800 connects the protective barrier layer 300 to the metal layer 700.

In S210, a silicon dioxide film layer may be formed at the inner wall of the connecting hole 100a as the first insulating base layer 210 by a chemical vapor deposition (CVD) method based on silane ($SiH_4$) or tetraethyl orthosilicate (TEOS). The thickness of the first insulating base layer 210 may be 0.2-2 μm.

In S220, the protective barrier base layer 310 may be deposited and further formed by a physical vapor deposition (PVD) method. The material of the protective barrier base layer 310 may be Ta and/or TaN, etc. The thickness of the protective barrier base layer 310 may be 0.05-0.1 μm.

In S230, the material of the second insulating layer 400 and the material of the first insulating base layer 210 may be the same. Certainly, the material of the second insulating layer 400 and the material of the first insulating base layer 210 may also be different. There is no limitation to this in the application.

In S240, the material of the connecting structure 500 may include metal, etc.

In S250, the trench 120c may be formed through dry etching. The material of the dielectric layer 120 and the material of the first insulating layer 200 may be the same.

In S260, the connecting base line 810 may be formed through PVD and the like. The connecting base line 810 covers the dielectric layer 120 at the inner wall of the trench 120c, the metal layer 700 and the protective barrier base layer 310.

In S270, the protective barrier layer 300 and the metal layer 700 are effectively connected through the connecting line 800.

In the embodiment, the protective barrier layer 300 and the metal layer 700 are connected through the connecting line 800, so that the protective barrier layer 300 can be grounded through the metal layer 700.

Certainly, in other embodiments, the protective barrier layer 300 may be grounded through the metal layer 700 in other ways, For example, the dielectric base layer 122 and the first insulating base layer 210 may also be etched from the second front surface 120a of the dielectric base layer 122 to form the trench 120c, and then the metal layer for leading out a signal is formed in the trench 120c, so that the protective barrier layer 300 is directly connected with the metal layer and grounded through the metal layer.

Figure 3:
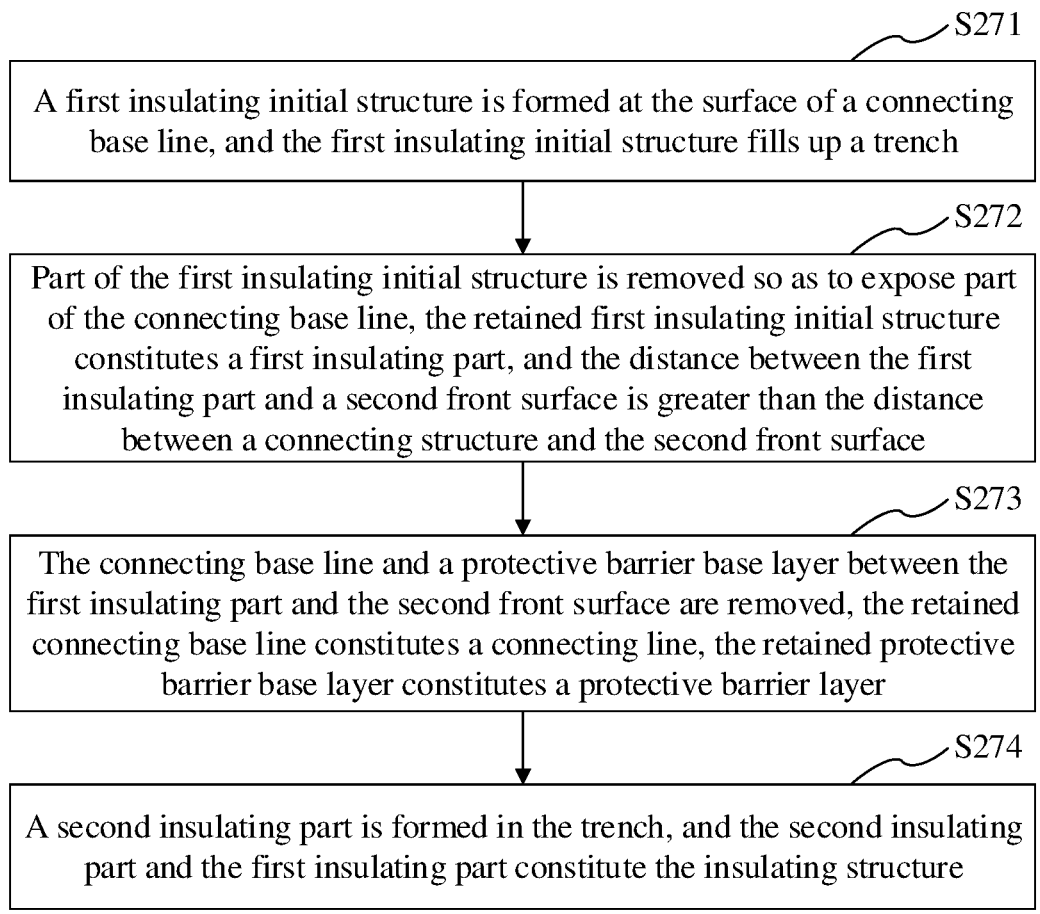
FIG. 3 is a flowchart of removing part of a connecting base line and part of a protective barrier base layer according to an embodiment.

In an embodiment, referring to FIG. 3, S270 may include the following operations.

Figure 21:
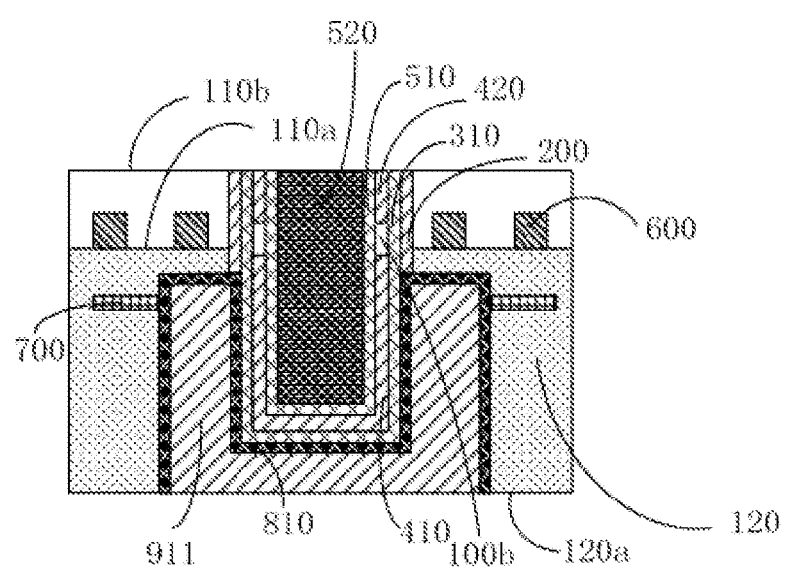
FIG. 21 is a seventeenth structural schematic structural diagram showing a semiconductor structure manufacturing process.

At S271, referring to FIG. 21, a first insulating initial structure 911 is formed at the surface of the connecting base line 810. The first insulating initial structure 911 fills up the trench 120c.

Figure 22:
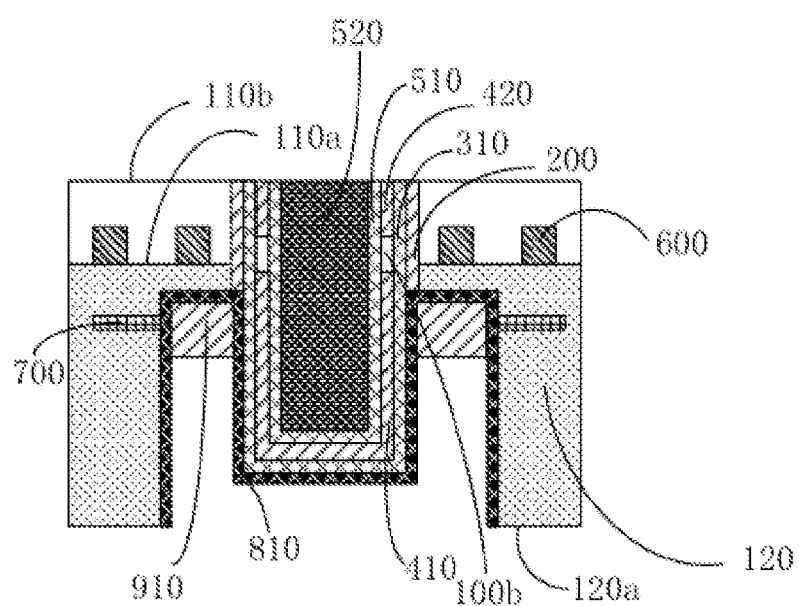
FIG. 22 is an eighteenth structural schematic structural diagram showing a semiconductor structure manufacturing process.

At S272, referring to FIG. 22, part of the first insulating initial structure 911 is removed so as to expose part of the connecting base line 810. The retained first insulating initial structure 911 constitutes a first insulating part 910. The distance between the first insulating part 910 and the second front surface 120a is greater than the distance between the protective barrier layer 300 and the second front surface 120a.

At S273, referring to FIG. 23, the connecting base line 810 and the protective barrier base layer 310 exposed between the first insulating part 910 and the second front surface 120a are removed. The retained connecting base line 810 constitutes the connecting line 800, and the retained protective barrier base layer 310 constitutes the protective barrier layer 300.

At S274, referring to FIG. 24, a second insulating part 920 is formed in the trench 120c, and the second insulating part 920 and the first insulating part 910 constitute an insulating structure 900.

In S271, a first insulating initial structure material (such as a silicon dioxide material) may be deposited on the surface of the connecting base line 810, and then polished to form the first insulating initial structure 911.

In S272, after part of the first insulating initial structure 911 is removed, the retained first insulating initial structure 911 constitutes the first insulating part 910.

At this time, the exposed part of the connecting base line 810 is a part that needs to be removed to form the connecting line 800.

In S273, the connecting base line 810 and the protective barrier base layer 310 between the first insulating part 910 and the second front surface 120a may be removed through a wet etching method. At this time, a second sub insulating layer 420 is exposed.

In S274, a second insulating initial structure material (such as a silicon dioxide material) may be deposited in the trench 120c, and then polished to form the second insulating part 920. The second insulating part 920 and the first insulating part 910 constitute the insulating structure 900.

In the embodiment, the connecting line 800 and the protective barrier layer 300 are insulated and closed through the insulating structure 900, so that the protective barrier layer 300 is stably grounded. At this time, the protective barrier layer 300, the connecting line 800 and the metal layer 700 form an electromagnetic shielding ring together, so as to prevent interference of the connecting structure 500 to peripheral signals.

Meanwhile, in the embodiment, the insulating structure 900 insulating and closing the connecting line 800 and the protective barrier layer 300 includes the second insulating part 920 and the first insulating part 910.

Certainly, in other embodiments, it may also form a structure with other forms by other methods. For example, after S273, the first insulating part 910 may also be removed, and then deposited and polished again to form an insulating structure.

In an embodiment, referring to FIG. 24, the second insulating layer 400 includes a first sub insulating layer 410 and a second sub insulating layer 420 spaced apart from each other. The protective barrier layer 300, the first sub insulating layer 410, the connecting structure 500 and the second sub insulating layer 420 are arranged in a surrounding manner to form an air gap 100b. Due to the poor thermal conductivity of air, the air gap 100b formed in the embodiment can effectively prevent heat generated by the connecting structure 500 from diffusing to the surrounding semiconductor device or dielectric layer, etc.

Moreover, at this time, the air gap 100b can also effectively isolate the connecting structure 500 from the substrate 110 and/or the dielectric layer 120 around it, so as to effectively prevent the stress deformation of the substrate 110 and/or the dielectric layer 120 due to the thermal expansion of the connecting structure 500, and then effectively prevent the crack phenomenon at the interface of the substrate 110 and/or the dielectric layer 120.

In an embodiment, referring to FIG. 24, the air gap 100b passes through an interface between the substrate 110 and the dielectric layer 120.

The interface between the substrate 110 and the dielectric layer 120 is easily affected by the thermal expansion of the connecting structure 500 to cause stress deformation, resulting in interface cracks.

In the embodiment, the air gap 100b passes through the interface between the substrate 110 and the dielectric layer 120, so that the air gap 100b isolates the interface between the substrate 110 and the dielectric layer 120 from the connecting structure 500, and thus, the cracks at the interface of the interface between can be effectively prevented.

Meanwhile, semiconductor devices are dense around the interface between the substrate 110 and the dielectric layer 120. The structure of the semiconductor devices usually penetrates through both sides of the interface between the substrate 110 and the dielectric layer 120.

The air gap 100b passes through the interface between the substrate 110 and the dielectric layer 120, so that the air gap 100b simultaneously isolates the connecting structure 500 from the substrate 110 and the dielectric layer 120 on both sides of the interface. Therefore, the embodiment can also effectively protect the semiconductor devices around the air gap 100b from thermal insulation, and can also prevent the semiconductor devices around the air gap 100b from affecting the performance due to stress deformation of the substrate 110 and/or the dielectric layer 120.

In an embodiment, the height of the portion of the air gap 100b corresponding to the dielectric layer 120 is less than the height of the portion corresponding to the substrate 110.

The dielectric layer 120 is a film layer formed on the substrate 110, and its thickness is much smaller than that of the substrate 110. Therefore, in the embodiment, the height of the portion of the air gap 100b corresponding to the dielectric layer 120 is relatively small, so that the structural instability of the dielectric layer 120 caused by the air gap 100b can be effectively prevented.

Moreover, heat generated in the dielectric layer 120 is relatively large. At this time, the height of the air gap 100b corresponding to the substrate 110 is relatively large, which makes the heat flow to the position with large gap, and thus is more conducive to heat dissipation and prevent the influence on peripheral devices.

Figure 4:
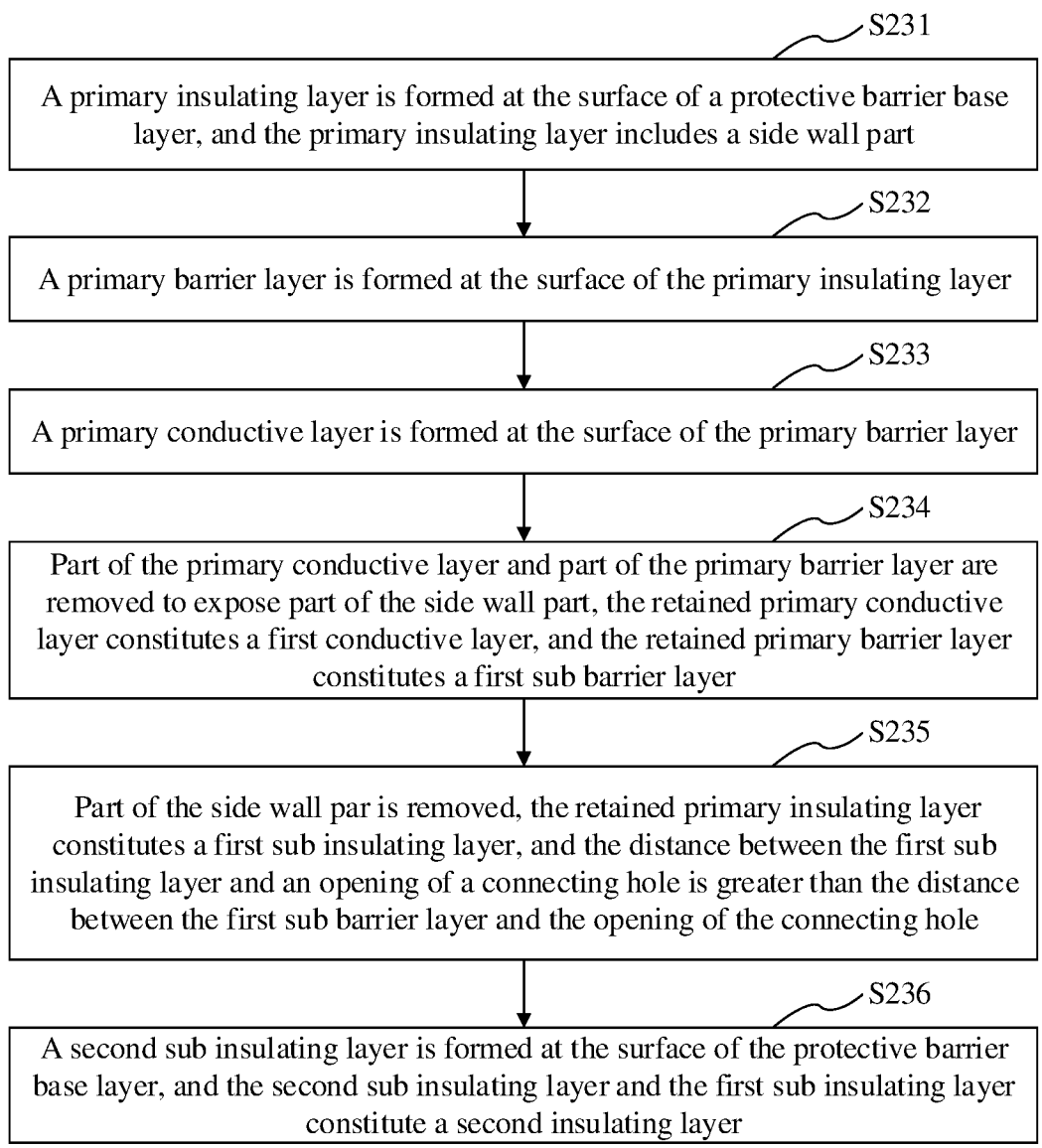
FIG. 4 is a flowchart of forming a second insulating layer at a surface of a protective barrier base layer according to an embodiment.

In an embodiment, referring to FIG. 4, S230 includes the following operations.

Figure 8:
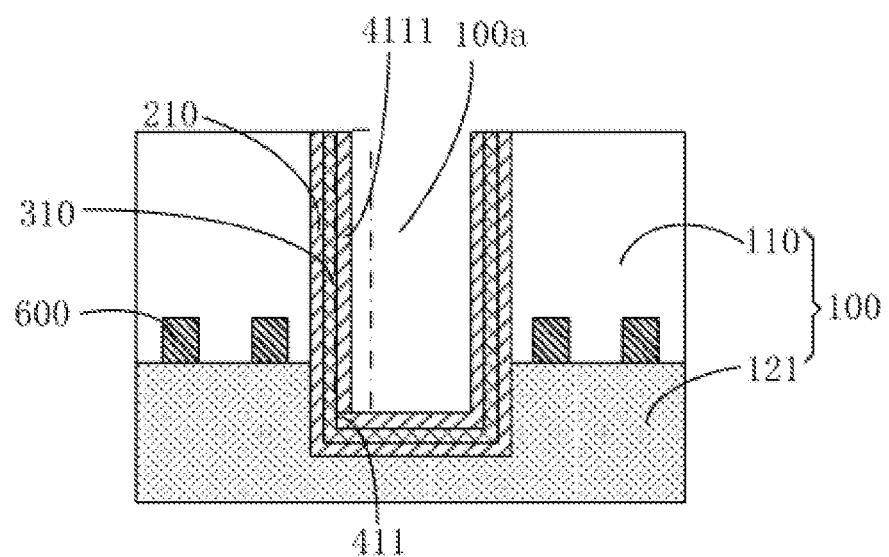
FIG. 8 is a fourth structural schematic structural diagram showing a semiconductor structure manufacturing process.

At S231, referring to FIG. 8, a primary insulating layer 411 is formed at the surface of the protective barrier base layer 310. The primary insulating layer 411 includes a side wall part 4111.

Figure 9:
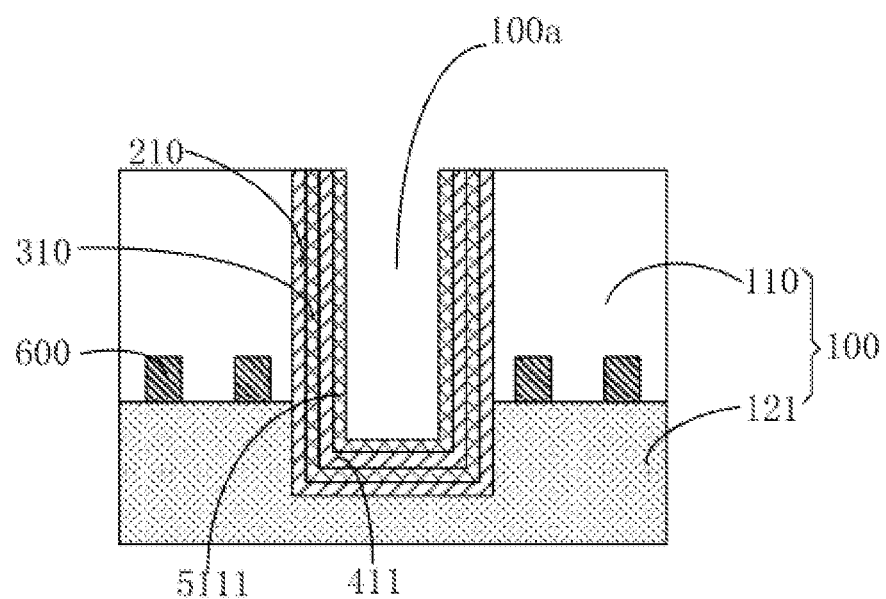
FIG. 9 is a fifth structural schematic structural diagram showing a semiconductor structure manufacturing process.

At S232, referring to FIG. 9, a primary barrier layer 5111 is formed at the surface of the primary insulating layer 411.

Figure 10:
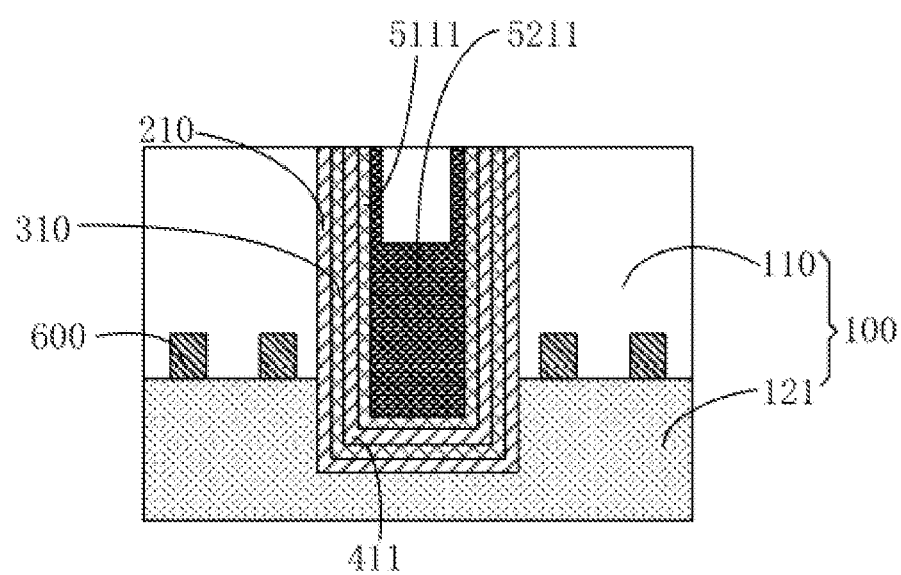
FIG. 10 is a sixth structural schematic structural diagram showing a semiconductor structure manufacturing process.

At S233, referring to FIG. 10, a primary conductive layer 5211 is formed at the surface of the primary barrier layer 5111.

Figure 11:
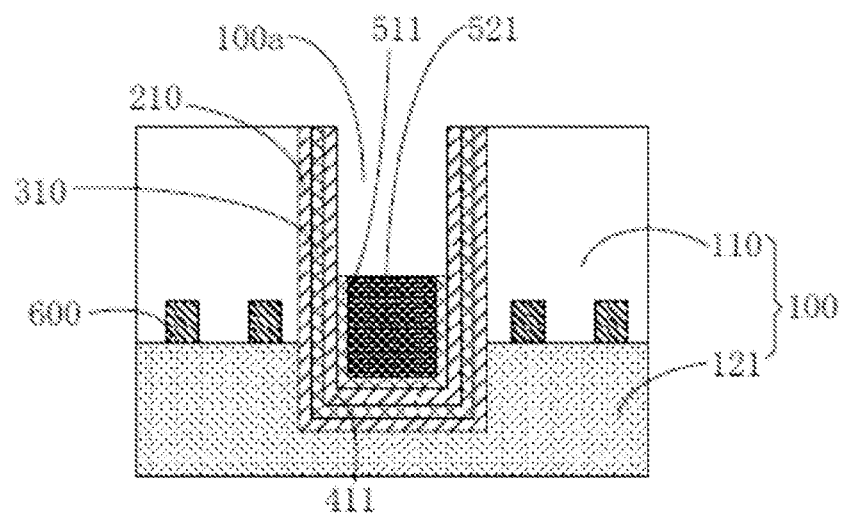
FIG. 11 is a seventh structural schematic structural diagram showing a semiconductor structure manufacturing process.

At S234, referring to FIG. 11, part of the primary conductive layer 5211 and part of the primary barrier layer 5111 are removed to expose part of the side wall part 4111. The retained primary conductive layer 5211 constitutes a first conductive layer 521, and the retained primary barrier layer 5111 constitutes a first sub barrier layer 511.

Figure 12:
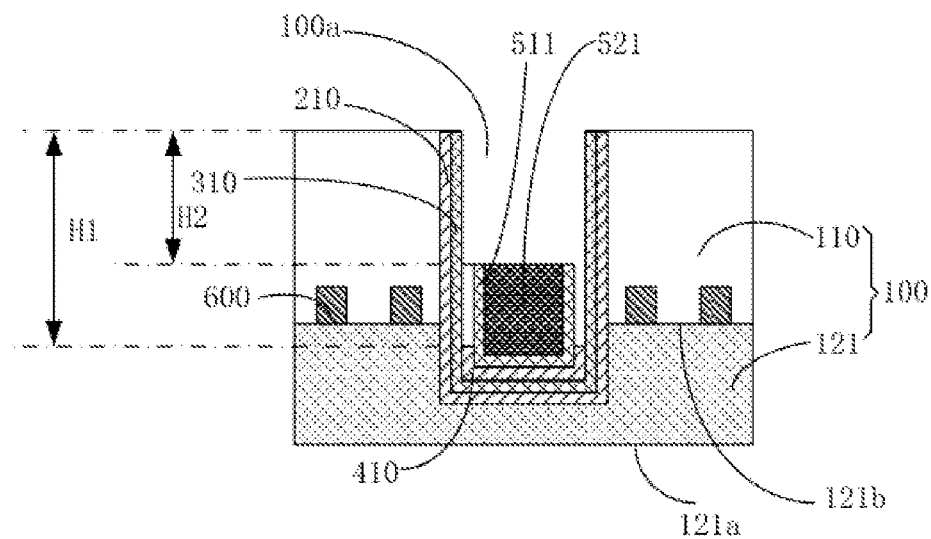
FIG. 12 is an eighth structural schematic structural diagram showing a semiconductor structure manufacturing process.

At S235, referring to FIG. 12, part of the side wall part 4111 is removed. The retained primary insulating layer 411 constitutes a first sub insulating layer 410. The distance H1 between the first sub insulating layer 410 and an opening of the connecting hole 100a is greater than the distance H2 between the first sub barrier layer 511 and the opening of the connecting hole 100a.

Figure 13:
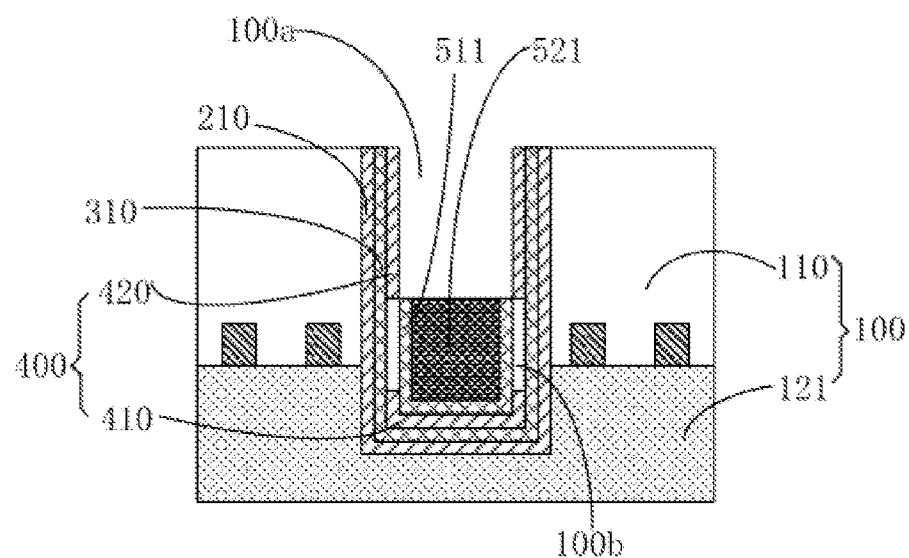
FIG. 13 is a ninth structural schematic structural diagram showing a semiconductor structure manufacturing process.

At S236, referring to FIG. 13, a second sub insulating layer 420 is formed at the surface of the protective barrier base layer 310. The second sub insulating layer 420 and the first sub insulating layer 410 constitute the second insulating layer 400.

At this time, the S240 includes the following operations.

At S241, referring to FIG. 14, a second sub barrier layer 512 is formed at the surface of the second sub insulating layer 420, the surface of the first sub barrier layer 511 and the surface of the first conductive layer 521. The second sub barrier layer 512 and the first sub barrier layer 511 constitute a barrier layer 510.

Figure 15:
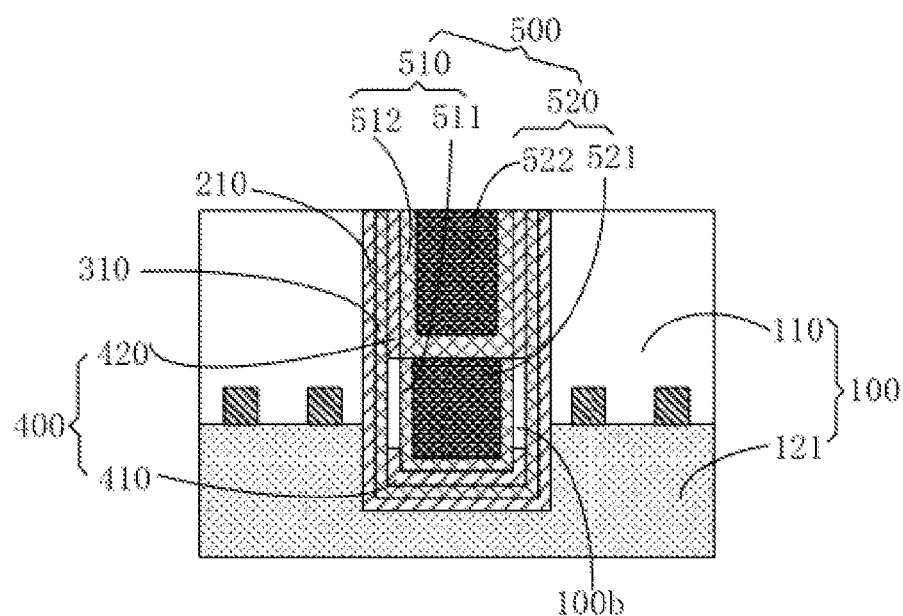
FIG. 15 is an eleventh structural schematic structural diagram showing a semiconductor structure manufacturing process.

At S242, referring to FIG. 15, a second conductive layer 522 is formed at the surface of the second sub barrier layer 512. The second conductive layer 522 and the first conductive layer 521 constitute a conductive structure 520. The conductive structure 520 and the barrier layer 510 constitute the connecting structure 500.

In S231, the material of the primary insulating layer 411 may be insulating materials, such as silicon dioxide.

As an example, when the material of the primary insulating layer 411 is silicon dioxide, a silicon dioxide film layer with the thickness of 0.2-2 μm may be deposited at the inner wall of the connecting hole 100a as the primary insulating layer 411 by a CVD method based on $SiH_4$ or TEOS.

In S232, the primary barrier layer 5111 may also be formed by a PVD method. The material of the primary barrier layer 5111 may be Ta and/or TaN. The thickness of the primary barrier layer 5111 may be 0.05-0.1 μm.

In S233, the material of the primary conductive layer 5211 may be metallic copper (Cu) and the like. Specifically, a copper seed layer may be formed on the surface of the primary conductive layer 5211 through the PVD method. Afterwards, electroplated Cu is formed on the surface of the copper seed layer through electroplating growth. The copper seed layer and the electroplated Cu together constitute the primary conductive layer 5211.

More specifically, since part of the primary conductive layer 5211 is also required to be removed in the subsequent S234 to form the air gap 100b, at this time, the primary conductive layer 5211 growing on the surface of the primary barrier layer 5111 may not fill up the connecting hole 100a. As an example, the filling thickness of the central portion of the primary conductive layer 5211 may be 20%-70% of the depth of the connecting hole 100a.

In S234, part of the primary barrier layer 5111 and part of the primary conductive layer 5211 which cover the side wall part 4111 may be removed by a mixed acid solution, so that the side wall part 4111 of the primary insulating layer 411 is partially exposed, and the first sub barrier layer 511 and the first conductive layer 521 are formed at the same time.

The first sub barrier layer 511 and the subsequently formed second sub barrier layer 512 constitute a barrier layer, which inhibits the thermal expansion stress generated by the conductive structure 520. Therefore, the materials of the first sub barrier layer 511 and the second sub barrier layer 512 are materials with the function of blocking thermal stress such as Ta or TaN.

After the side wall part 4111 of the primary insulating layer 411 is partially exposed, S550 is executed, so that the air gap 100b can be realized more easily.

In S235, the side wall part 4111 of the primary insulating layer 411 (such as a silicon dioxide film layer) in the connecting hole 100a may be etched by hydrofluoric acid or dry etching to form the first sub insulating layer 410.

Specifically, after part of the side wall part 4111 is removed, the distance H1 between the surface of the first sub insulating layer 410 formed by the retained primary insulating layer 411 and an opening of the connecting hole 100a is greater than the distance H2 between the surface of the first sub barrier layer 511 and the opening of the connecting hole 100a. That is, after part of the side wall part 4111 is removed in the direction as shown in FIG. 11, the surface of the first sub insulating layer 410 formed by the retained primary insulating layer 411 is lower than the surface of the first sub barrier layer 511.

In S236, specifically, the second sub insulating layer 420 may be formed through the CVD method. The material of the second sub insulating layer 420 and the material of the first sub insulating layer 410 may be the same or not.

In S241, the material of the second sub barrier layer 512 and the material of the first sub barrier layer 511 may be the same. Certainly, they may also be different.

Meanwhile, since the second sub barrier layer 512 is formed at the surface of the second sub insulating layer 420, the surface of the first sub barrier layer 511 and the surface of the first conductive layer 521, the second sub barrier layer 512 is connected with the first sub barrier layer 511, thereby well inhibiting the thermal expansion stress of the conductive structure 330 therein.

In S242, the material of the second conductive layer 522 and the material of the first conductive layer 521 may be the same or not, which is not limited in the application.

As an example, when both the material of the second conductive layer 522 and the material of the first conductive layer 521 are Cu, the formation process may be similar to that of the primary conductive layer 5211. A copper seed layer may be formed, and then electroplated Cu is formed on the Cu seed crystal layer to form the second conductive layer 522.

In the embodiment, the primary insulating layer 411 is formed, and then part of the side wall part 4111 thereof is removed, so that an air gap 100b can be formed conveniently and effectively.

Moreover, in the embodiment, the second sub barrier layer 512 is provided between the second conductive layer 522 and the first conductive layer 521. Therefore, the second sub barrier layer 512 can effectively prevent the possible inconsistency between the second conductive layer 522 and the first conductive layer 521 which are formed in two phases due to grain size, etc., and cracks at the interface due to the influence of thermal stress in the subsequent annealing process.

Certainly, the application is not limited to this. In other embodiments, in S241, a second sub barrier base layer is formed at the surface of the second sub insulating layer 420, the surface of the first sub barrier layer 511 and the surface of the first conductive layer 521.

Afterwards, at least part of the second sub barrier base layer at the surface of the first conductive layer 521 may be removed at first. The retained second sub barrier base layer constitutes the second sub barrier layer 512. The second sub barrier layer 512 and the first sub barrier layer 511 constitute the barrier layer 520.

Figure 16:
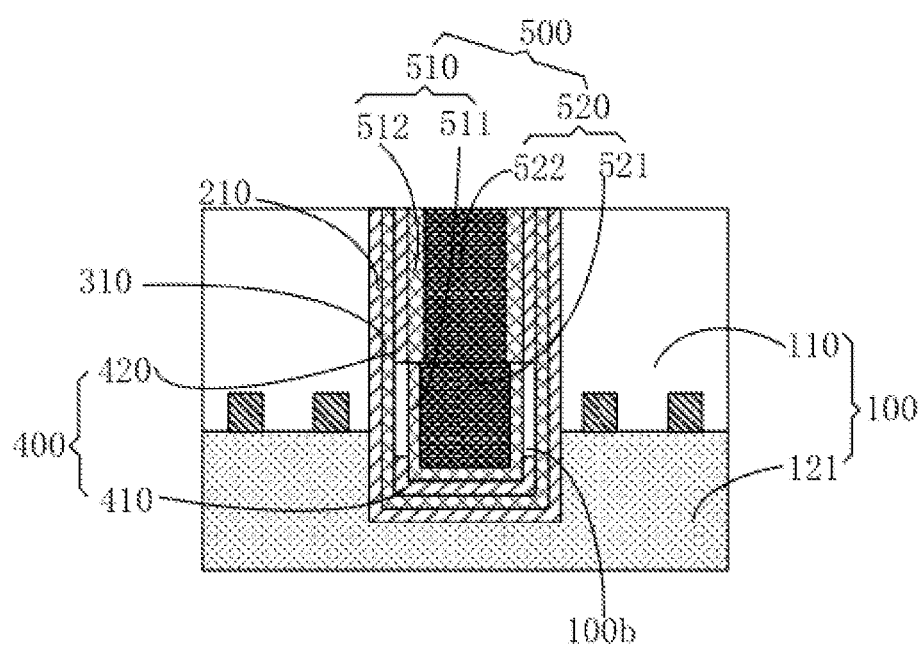
FIG. 16 is a twelfth structural schematic structural diagram showing a semiconductor structure manufacturing process.
Figure 17:
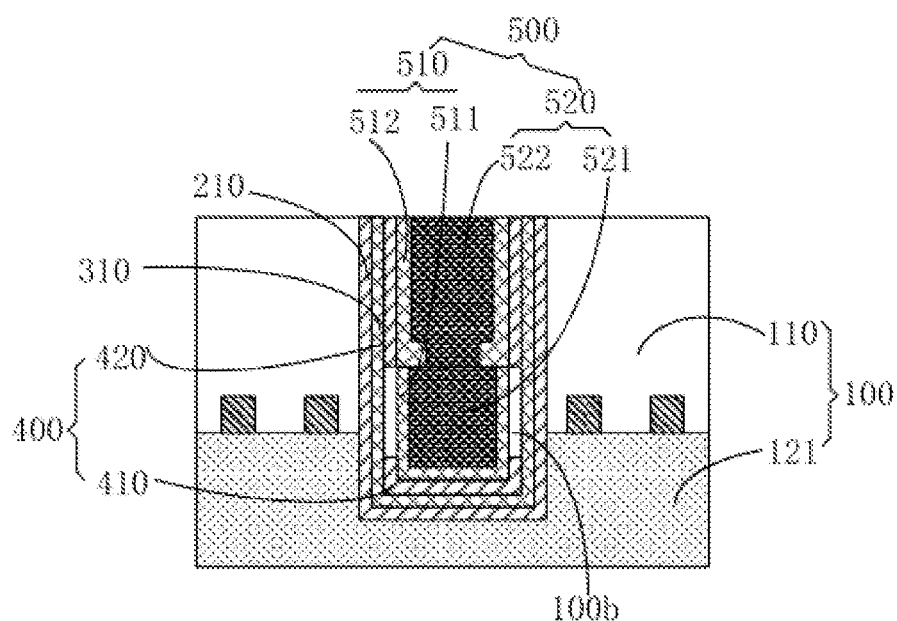
FIG. 17 is a thirteenth structural schematic structural diagram showing a semiconductor structure manufacturing process.

Then, referring to FIG. 16 or FIG. 17, the second conductive layer 522 is formed at the surface of the second sub barrier layer 512 and the exposed surface of the first conductive layer 521.

At this time, the second conductive layer 522 and the first conductive layer 521 are contacted and connected, thereby reducing the contact resistance between the second conductive layer 522 and the first conductive layer 521.

Referring to FIG. 17, when the second sub barrier layer 512 covering the surface of the first conductive layer 521 is partially removed, not only the contact resistance is reduced but also the influence of thermal stress between the second conductive layer 522 and the first conductive layer 521 which are formed in two phases is prevented.

Meanwhile, when the central portion of the second sub barrier layer 512 covering the surface of the first conductive layer 521 is removed and the edge portion retains, the retained edge portion can also help to prevent the poor contact between the second sub barrier layer 512 and the first sub barrier layer 511 from affecting the inhibition of the thermal expansion stress of the conductive structure 520 (including the first conductive layer 521 and the second conductive layer 522) therein.

In an embodiment, referring to FIG. 15, FIG. 16 or FIG. 17, the thickness of the second sub barrier layer 512 is greater than that of the first sub barrier layer 511.

At this time, the poor contact between the second sub barrier layer 512 and the first sub barrier layer 511 may be effectively prevented from affecting the inhibition of the thermal expansion stress of the conductive structure 520 (including the first conductive layer 521 and the second conductive layer 522) therein.

It should be understood that although various steps in the flowcharts of FIG. 1 to FIG. 4 are sequentially displayed by following arrows, the steps are not sequentially executed necessarily in the order indicated by the arrows. Unless explicitly indicated in the disclosure, there is no strict sequence restriction on the execution of these steps, and these steps may be executed in other order. Moreover, at least part of steps in FIG. 1 to FIG. 4 may include multiple steps or multiple stages, these steps or stages are not executed necessarily at the same time, and may be executed at different times. These steps or stages are not sequentially executed necessarily, and may be executed in turn or alternatively with other steps or at least part of steps or stages in other steps.

In an embodiment, a semiconductor structure is further provided. Referring to FIG. 25, the semiconductor structure may include a base 100, a connecting hole 100a, a first insulating layer 200, a protective barrier layer 300, a second insulating layer 400 and a connecting structure 500.

The base 100 includes a substrate 110 and a dielectric layer 120. The substrate 110 is provided with a first front surface 110a and a first back surface 110b which are opposite. The dielectric layer 120 is located at the first front surface 110a. The connecting hole 100a penetrates through the substrate 110 and extends into the dielectric layer 120. The first insulating layer 200 is located at the surface of the inner wall of the connecting hole 100a. The protective barrier layer 300 is located at the surface of the first insulating layer 200 and grounded. The second insulating layer 400 is located at the surface of the protective barrier layer 300. The connecting structure 500 is located at the surface of the second insulating layer 400 and filled in the connecting hole 100a.

In the embodiment, on one hand, the protective barrier layer 300 located in the connecting hole 100a is configured to prevent the particles such as metal in the connecting structure 500 from becoming larger during annealing, so as to inhibit thermal stress. On the other hand, the protective barrier layer 300 located in the connecting hole 100a is grounded, so that it also forms an electromagnetic shielding ring on the periphery of the connecting structure 500 while inhibiting stress, so as to effectively avoid signal coupling among the various connecting structures 500 and among the connecting structures 500 and surrounding semiconductor devices.

In an embodiment, continuously referring to FIG. 25, a metal layer is arranged in the dielectric layer 120. The protective barrier layer 300 is grounded through the metal layer.

In an embodiment, continuously referring to FIG. 25, a connecting line 800 is also arranged in the dielectric layer 120. The connecting line 800 connects the protective barrier layer 300 with the metal layer 700. The metal layer 700, the connecting line 800 and the protective barrier layer 300 together constitute an electromagnetic shielding ring.

In an embodiment, continuously referring to FIG. 25, an insulating structure 900 is also arranged in the dielectric layer 120. The insulating structure 900 insulates and closes the connecting line 800 and the protective barrier layer 300.

In an embodiment, continuously referring to FIG. 25, the insulating structure 900 includes a first insulating part 910 and a second insulating part 920. The first insulating part 910 is located between the connecting line 800 and the second insulating part 920. The second insulating part 920 insulates and closes the connecting line 800 and the protective barrier layer 300.

Figure 26:
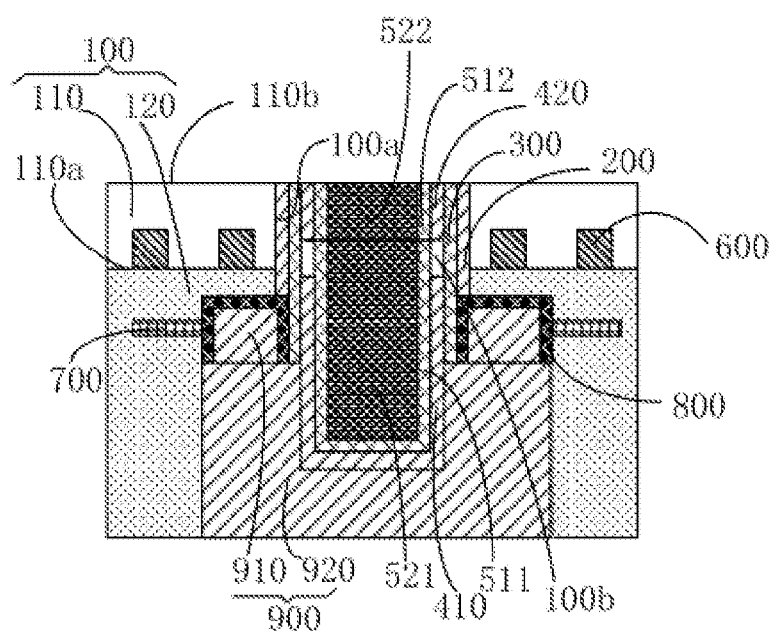
FIG. 26 is a third schematic diagram of semiconductor structures in different embodiments.
Figure 27:
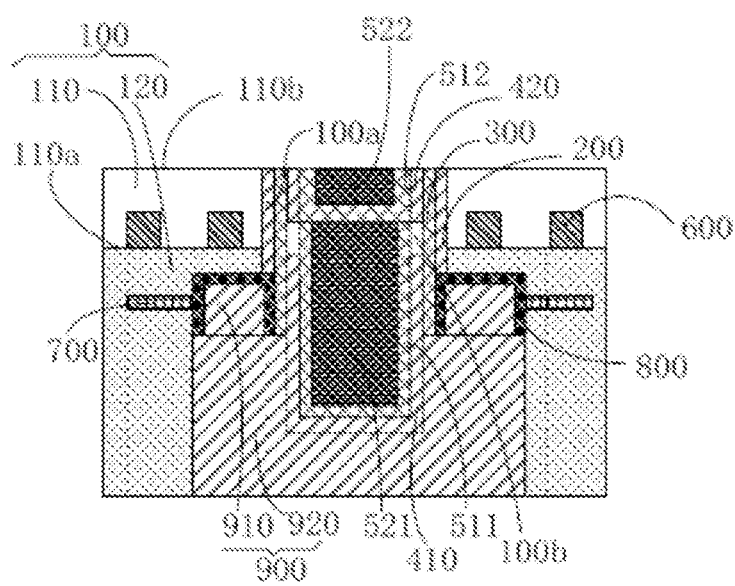
FIG. 27 is a fourth schematic diagram of semiconductor structures in different embodiments.

In an embodiment, referring to FIG. 24, FIG. 26 or FIG. 27, the second insulating layer 400 includes a first sub insulating layer 410 and a second sub insulating layer 420 spaced apart from each other. The protective barrier layer 300, the first sub insulating layer 410, the connecting structure 500 and the second sub insulating layer 420 are arranged in a surrounding manner to form an air gap 100b.

In an embodiment, referring to FIG. 24, the air gap 100b passes through an interface between the substrate 110 and the dielectric layer 120.

In an embodiment, the height of the portion of the air gap 100b corresponding to the dielectric layer 120 is less than the height of the portion corresponding to the substrate 110.

In an embodiment, referring to FIG. 26 or FIG. 27, the connecting structure 500 includes a barrier layer 510 and a conductive structure 520. The barrier layer 510 includes a first sub barrier layer 511 and a second sub barrier layer 512 which are interconnected. The conductive structure 520 includes a first conductive layer 521 and a second conductive layer 522. The first sub barrier layer 511 is located at the surface of the first sub insulating layer 410, and the first conductive layer 521 is located at the surface of the first sub barrier layer 511. The second sub barrier layer 512 is located at the surface of the second sub insulating layer 420. The second conductive layer 522 is located at the surface of the second sub barrier layer 512, and is filled in the connecting hole 100a.

The second conductive layer 522 and the first conductive layer 521 are separated by the second sub barrier layer 512 (referring to FIG. 27). Alternatively, the second conductive layer 522 is connected with the first conductive layer 521 (referring to FIG. 26).

In an embodiment, referring to FIG. 27, the thickness of the second sub barrier layer 512 is greater than that of the first sub barrier layer 511.

In an embodiment, a stacked structure is further provided. The stacked structure is formed by processing any one of the above-described semiconductor structure.

Figure 28:
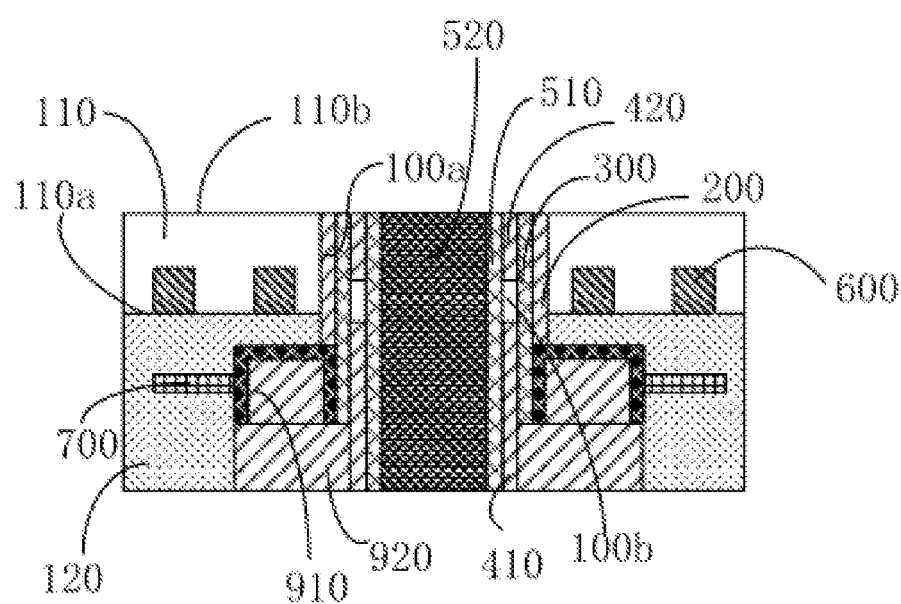
FIG. 28 is a first schematic diagram of processed semiconductor structures for stacking in different embodiments.
Figure 29:
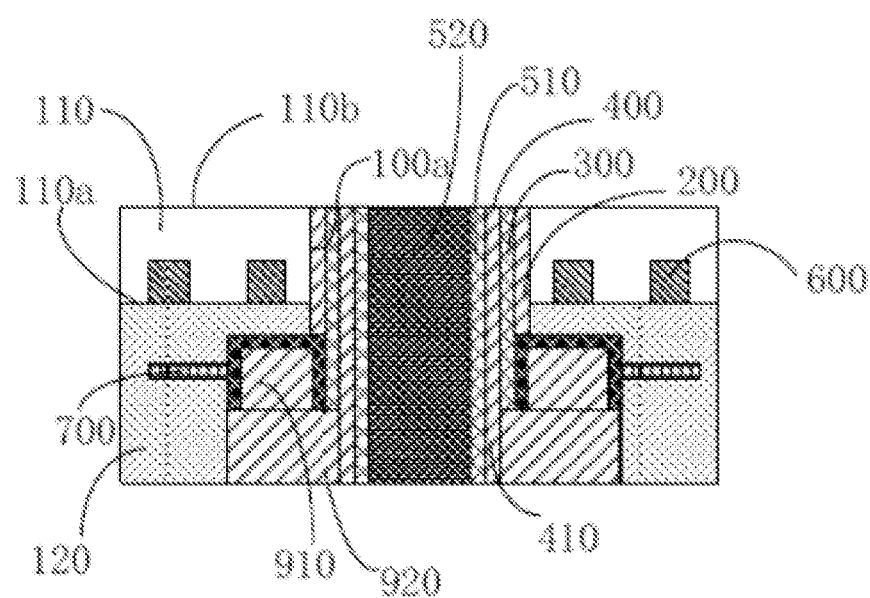
FIG. 29 is a second schematic diagram of processed semiconductor structures for stacking in different embodiments.

Specifically, when the stacked structure is formed, the above semiconductor structure needs to be subjected to processing technologies such as etching or flattening to expose the connecting structure 500 in the dielectric layer 120 (referring to FIG. 28 or FIG. 29). By doing so, the connecting structure 500 in the connecting hole 100a is electrically connectable when it is stacked with adjacent semiconductor structures, thus can be used for signal transmission.

More specifically, when the connecting structure 500 includes the barrier layer 510 and the conductive structure 520, the conductive structure 520 needs to be exposed for signal transmission.

The specific definition and technical effect of the semiconductor structure may refer to the above definition of the formation method of the semiconductor structure, which will not be elaborated here.

Certainly, it should be understood that, the semiconductor structure of the application is not limited to the formation method of the semiconductor structure in the above embodiment.

In the descriptions of the specification, the descriptions made with reference to terms "an embodiment", "an ideal embodiment" or the like refer to that specific features, structures, materials or characteristics described in combination with the embodiment or the example are included in at least one embodiment or example of the disclosure. In the specification, schematic description on the above terms not always refers to same embodiments or demonstrations.

Each technical feature of the above mentioned embodiments may be combined freely. For simplicity of description, not all possible combinations of each technical solution in the above mentioned embodiments are described. However, any combination of these technical features shall fall within the scope recorded in the specification without conflicting.

The above mentioned embodiments only express some implementation modes of the application and are specifically described in detail and not thus understood as limits to the patent scope of the application. It is to be pointed out that those of ordinary skill in the art may further make multiple transformations and improvements without departing from the concept of the application and all of these shall fall within the scope of protection of the application. Therefore, the scope of patent protection of the application should be subject to the appended claims.

What is claimed is:

1. A semiconductor structure, comprising:
   a base, comprising a substrate and a dielectric layer, the substrate being provided with a first front surface and a first back surface which are opposite, and the dielectric layer being located at the first front surface;
   a connecting hole, penetrating through the substrate and extending into the dielectric layer;
   a first insulating layer, located at a surface of an inner wall of the connecting hole;

a protective barrier layer, located at a surface of the first insulating layer and grounded;

a second insulating layer, located at a surface of the protective barrier layer, the second insulating layer comprises a first sub insulating layer and a second sub insulating layer spaced apart from each other; and a connecting structure, located at a surface of the second insulating layer and filling up the connecting hole; and wherein the protective barrier layer, the first sub insulating layer, the connecting structure and the second sub insulating layer are arranged in a surrounding manner to form an air gap.

2. The semiconductor structure according to claim 1, wherein a metal layer is arranged in the dielectric layer, and the protective barrier layer is grounded through the metal layer.

3. The semiconductor structure according to claim 2, wherein a connecting line is also arranged in the dielectric layer, the connecting line connects the protective barrier layer with the metal layer, and wherein the metal layer, the connecting line and the protective barrier layer together constitute an electromagnetic shielding ring.

4. The semiconductor structure according to claim 3, wherein an insulating structure is also arranged in the dielectric layer, and the insulating structure seals the connecting line and the protective barrier layer.

5. The semiconductor structure according to claim 4, wherein the insulating structure comprises a first insulating part and a second insulating part, the first insulating part is located between the connecting line and the second insulating part, and the second insulating part seals the connecting line and the protective barrier layer.

6. The semiconductor structure according to claim 1, wherein the air gap passes through an interface between the substrate and the dielectric layer.

7. The semiconductor structure according to claim 6, wherein a height of a portion of the air gap corresponding to the dielectric layer is less than a height of a portion of the air gap corresponding to the substrate.

8. The semiconductor structure according to claim 1, wherein the connecting structure comprises a barrier layer and a conductive structure, the barrier layer comprises a first sub barrier layer and a second sub barrier layer which are interconnected, the conductive structure comprises a first conductive layer and a second conductive layer, the first sub barrier layer is located at a surface of the first sub insulating layer, the first conductive layer is located at a surface of the first sub barrier layer, the second sub barrier layer is located at a surface of the second sub insulating layer, the second conductive layer is located at a surface of the second sub barrier layer and filled in the connecting hole, the second conductive layer and the first conductive layer are separated by the second sub barrier layer, or the second conductive layer is connected with the first conductive layer.

9. The semiconductor structure according to claim 8, wherein a thickness of the second sub barrier layer is greater than a thickness of the first sub barrier layer.

10. A stacked structure, formed by processing the semiconductor structure according to claim 1.

11. A method for forming a semiconductor structure, comprising:

providing a base, wherein the base comprises a substrate and a dielectric base layer, the substrate is provided with a first front surface and a first back surface which are opposite, the dielectric base layer is located at the first front surface, a connecting hole is formed in the base, and the connecting hole penetrates through the substrate and extends into the dielectric base layer; and forming a first insulating layer, a protective barrier layer, a second insulating layer and a connecting structure in the connecting hole, wherein the first insulating layer is located at a surface of an inner wall of the connecting hole, the protective barrier layer is located at a surface of the first insulating layer, the second insulating layer is located at a surface of the protective barrier layer, and the connecting structure is located at a surface of the second insulating layer and filled in the connecting hole, wherein the second insulating layer comprises a first sub insulating layer and a second sub insulating layer spaced apart from each other;

wherein part of the dielectric base layer is removed, so that the protective barrier layer is grounded, and the dielectric base layer that is retained constitutes a dielectric layer, and the protective barrier layer, the first sub insulating layer, the connecting structure and the second sub insulating layer are arranged in a surrounding manner to form an air gap.

12. The method according to claim 11, wherein the connecting hole is formed by etching from the first back surface.

13. The method according to claim 11, wherein the dielectric base layer is provided with a metal layer, and the protective barrier layer is grounded through the metal layer.

14. The method according to claim 13, wherein the dielectric base layer is provided with a second front surface which is far away from the first front surface;

said forming a first insulating layer, a protective barrier layer, a second insulating layer and a connecting structure in the connecting hole comprising:

forming a first insulating base layer at the surface of the inner wall of the connecting hole;

forming a protective barrier base layer at a surface of the first insulating base layer;

forming the second insulating layer at a surface of the protective barrier base layer;

forming the connecting structure at the surface of the second insulating layer;

etching the dielectric base layer and the first insulating base layer from the second front surface of the dielectric base layer to form a trench, the trench exposing the protective barrier base layer and the metal layer, the dielectric base layer that is retained constituting the dielectric layer, and the first insulating base layer that is retained constituting the first insulating layer;

forming a connecting base line in the trench; and removing part of the connecting base line and part of the protective barrier base layer, the connecting base line that is retained constituting a connecting line, the protective barrier base layer that is retained constituting the protective barrier layer, and the connecting line connecting the protective barrier layer with the metal layer.

15. The method according to claim 14, said removing part of the connecting base line and part of the protective barrier base layer comprising:

forming a first insulating initial structure at a surface of the connecting base line, the first insulating initial structure filling up the trench;

removing part of the first insulating initial structure so as to expose part of the connecting base line, the first insulating initial structure that is retained constituting a first insulating part, and a distance between the first insulating part and the second front surface is greater than a distance between the connecting structure and the second front surface;

removing the connecting base line and the protective barrier base layer between the first insulating part and the second front surface, the connecting base line that is retained constituting the connecting line, and the protective barrier base layer that is retained constituting the protective barrier layer; and forming a second insulating part in the trench, the second insulating part and the first insulating part constituting an insulating structure.

16. The method according to claim 11, wherein the air gap passes through an interface between the substrate and the dielectric layer.

17. The method according to claim 11, said forming the second insulating layer at a surface of the protective barrier base layer comprising:

forming a primary insulating layer at the surface of the protective barrier base layer, the primary insulating layer comprising a side wall part;

forming a primary barrier layer at a surface of the primary insulating layer;

forming a primary conductive layer at a surface of the primary barrier layer;

removing part of the primary conductive layer and part of the primary barrier layer so as to expose part of the side wall part, the primary conductive layer that is retained constituting a first conductive layer, and the primary barrier layer that is retained constituting the first sub barrier layer;

removing part of the side wall part, the primary insulating layer that is retained constituting a first sub insulating layer, and a distance between the first sub insulating layer and an opening of the connecting hole being greater than a distance between the first sub barrier layer and the opening of the connecting hole; and forming a second sub insulating layer at the surface of the protective barrier base layer, the second sub insulating layer and the first sub insulating layer constituting the second insulating layer, said forming the connecting structure at the surface of the second insulating layer comprising:

forming a second sub barrier layer at a surface of the second sub insulating layer, a surface of the first sub barrier layer and a surface of the first conductive layer, the second sub barrier layer and the first sub barrier layer constituting a barrier layer; and forming a second conductive layer on the surface of the second sub barrier layer, the second conductive layer and the first conductive layer constituting the conductive structure, and the conductive structure and the barrier layer constituting the connecting structure.

18. The method according to claim 17, wherein a thickness of the second sub barrier layer is greater than a thickness of the first sub barrier layer.

* * * * *